United States Patent
Bendraoui et al.

(10) Patent No.: US 8,239,429 B2
(45) Date of Patent: Aug. 7, 2012

(54) OUTPUT BUFFER RECEIVING FIRST AND SECOND INPUT SIGNALS AND OUTPUTTING AN OUTPUT SIGNAL, AND CORRESPONDING ELECTRONIC CIRCUIT

(75) Inventors: Abdellatif Bendraoui, Saint-Julien de Concelles (FR); Joel Chatal, Carquefou (FR); Stanislas Gibet, Carquefou (FR)

(73) Assignee: Atmel Corporation, San Jose, CA (US)

( * ) Notice: Subject to any disclaimer, the term of this patent is extended or adjusted under 35 U.S.C. 154(b) by 1106 days.

(21) Appl. No.: 11/786,424

(22) Filed: Apr. 11, 2007

(65) Prior Publication Data

US 2007/0250554 A1    Oct. 25, 2007

(30) Foreign Application Priority Data

Apr. 11, 2006  (FR) ...................... 06 03208

(51) Int. Cl.
*G06F 7/48* (2006.01)
(52) U.S. Cl. .............................. 708/190; 307/27; 307/85
(58) Field of Classification Search .................. 708/190; 326/27
See application file for complete search history.

(56) References Cited

U.S. PATENT DOCUMENTS

| | | | | |
|---|---|---|---|---|
| 4,731,553 A * | 3/1988 | Van Lehn et al. | ............... | 326/27 |
| 4,972,101 A * | 11/1990 | Partovi et al. | ................... | 326/86 |
| 4,987,324 A * | 1/1991 | Wong et al. | ....................... | 326/27 |
| 4,992,676 A * | 2/1991 | Gerosa et al. | ................... | 326/27 |
| 5,089,722 A | 2/1992 | Amedeo | ....................... | 307/443 |
| 5,329,175 A | 7/1994 | Peterson | ....................... | 307/443 |
| 5,355,029 A * | 10/1994 | Houghton et al. | ............... | 326/26 |
| 5,500,610 A * | 3/1996 | Burstein | ......................... | 326/85 |
| 5,959,468 A * | 9/1999 | Wendell et al. | ................. | 326/83 |
| 5,959,474 A * | 9/1999 | Park et al. | ...................... | 327/112 |
| 6,051,995 A | 4/2000 | Pollachek | ........................ | 326/87 |
| 7,463,051 B2 * | 12/2008 | Bartolini et al. | ................ | 326/26 |
| 2001/0011910 A1 * | 8/2001 | Tanaka et al. | ................... | 326/68 |
| 2005/0093589 A1 | 5/2005 | Deutschmann et al. | ...... | 327/134 |

OTHER PUBLICATIONS

French Search Report for FR 0603208.

\* cited by examiner

*Primary Examiner* — Chat Do
*Assistant Examiner* — Kevin G Hughes
(74) *Attorney, Agent, or Firm* — Fish & Richardson P.C.

(57) ABSTRACT

An output buffer is provided, to which first and second input signals are applied and that delivers an output signal. The output buffer includes a second offset switching stage installed in cascade downstream from a first switching stage. The second offset switching stage generates control points shifted in time with respect to memory points.

18 Claims, 4 Drawing Sheets

PRIOR ART

PRIOR ART

OUTPUT BUFFER RECEIVING FIRST AND SECOND INPUT SIGNALS AND OUTPUTTING AN OUTPUT SIGNAL, AND CORRESPONDING ELECTRONIC CIRCUIT

CROSS-REFERENCE TO RELATED APPLICATION

None.

FIELD OF THE DISCLOSURE

The domain of the disclosure is the one of integrated electronic circuits and particularly circuits (such as logical gates, memories or even microprocessors) including output buffers (also called output peripherals in this description).

Such buffers are well known according to prior art. They are usually placed near the periphery of an integrated circuit and are used to interface electrical signals from the core towards the outside of the circuit.

More precisely, the disclosure relates to immunity of such buffers from noise and/or electromagnetic disturbances.

BACKGROUND

In general, all electronic equipment generates electromagnetic noise that could disturb its own operation or the operation of equipment nearby it.

The proliferation of equipment based on electronics and radio systems required the definition of regulations in terms of ElectroMagnetic Compatibility (EMC).

According to one commonly accepted definition, electromagnetic compatibility means the capability of equipment or a system to operate satisfactorily within its electromagnetic environment without itself producing any intolerable electromagnetic disturbances for all equipment located in this environment.

Therefore, the electromagnetic environment has become an essential parameter to be taken into account in the design of any electronic equipment.

At the moment, more and more integrated circuits are equipped with tens or even hundreds of very fast output peripherals.

However, these peripherals generate high noise levels that can disturb the operation of nearby systems. For example, this is a problem particularly in the field of onboard electronics.

Remember that the main source of conducted and/or radiated electromagnetic disturbances is "di/dt" current peaks and "dv/dt" voltage peaks generated each time that these peripherals are switched.

Identical elements or signals are denoted by the same alphanumeric reference on all the figures in this document.

The electrical diagram for a conventional output buffer reference 100 (also subsequently referred to as first classical buffer or buffer without anti short-circuit and without EMC optimization), is also shown with reference to FIG. 1.

In order to simplify the description we will limit the remainder of the description to the special case of integrated circuits operating at power supply voltages of 0V and 5V. Those skilled in the art will be able to extend this information without any difficulty to any type of voltage that will power an onboard electronic circuit.

The output buffer 100 receives a first input signal S1 on a first input 1 and a second input signal S2 on a second input 2, and an output signal SOUT at the output 3.

This output buffer 100 comprises a first control stage 34 comprising first high and low inverters 301 and 302, and a first switching stage 35 including first high and low switching means 303 and 304.

More precisely, the first high inverter 301 receives the first input signal S1 on an input 341 and it outputs a first control signal SCOM1 to a first mid-point A. This high inverter 301 comprises a transistor TP1, the source SP1 of which is connected to the power supply VCC of the circuit (also called the high logical level in the remainder of this description), and the drain DP1 of which is connected to the first mid-point A, and a transistor TN1, the source SN1 of which is connected to the reference potential VSS (also called the low logical level in the remainder of the description), and the drain DN1 of which is connected to the drain DP1 of the transistor TP1. The transistors TP1 and TN1 receive the first input signal S1 on their gates GP 1 and GN1.

Thus, when the first input signal S1 is approximately equal to the reference potential VSS, namely 0V, the transistor TP1 is made conducting and the transistor TN1 is blocked. The high inverter 301 then outputs a first control signal SCOM1 to the first mid-point A, that is approximately equal to the power supply VCC, namely 5V.

Conversely, when the first input signal S1 is approximately equal to the power supply VCC, namely 5V, the transistor TN1 is made conducting and the transistor TP1 is blocked. The high inverter 301 then outputs a first control signal SCOM1 to the first mid-point A that is approximately equal to the reference potential VSS, namely 0V.

The first low inverter 302 receives the second input signal S2 on an input 342 and it outputs a second control signal SCOM2 to a second mid-point B. This low inverter 302 comprises a transistor TP2, the source SP2 of which is connected to the power supply VCC and the drain DP2 of which is connected to the second mid-point B, and a transistor TN2, the source SN2 of which is connected to the reference potential VSS and the drain DN2 of which is connected to the drain DP2 of the transistor TP2. The transistors TP2 and TN2 receive the second input signal S2 on their gates GP2 and GN2.

Thus, when the second input signal S2 is approximately equal to the reference potential VSS, namely 0V, the transistor TP2 is made conducting and the transistor TN2 is blocked. The low inverter 302 then outputs a second control signal SCOM2 to the second mid-point B, that is approximately equal to the power supply VCC, namely 5V.

Conversely, when the second input signal S2 is approximately equal to the power supply VCC, namely 5V, the transistor TN2 is made conducting and the transistor TP2 is blocked. The low inverter 302 then outputs a second control signal SCOM2 to the second mid-point B that is approximately equal to the reference potential VSS, namely 0V.

The first high and low switching means 303 and 304 comprise a transistor TP3 and a transistor TN3 respectively.

The transistor TP3, the source SP3 of which is connected to the power supply VCC and the drain DP3 of which is connected to the output 3, forms a switch controlled by the first control signal SCOM1 (applied to the gate DP3).

The transistor TN3, the source SN3 of which is connected to the reference potential VSS and the drain DN3 of which is connected to the drain DP3 of the transistor TP3, forms a switch controlled by the second control signal SCOM2 (applied to the gate GN3).

The following describes operation of the output buffer 100 according to prior art for four combinations of input signals S1 and S2, with reference to FIG. 1.

For the first combination, the first and second input signals S1 and S2 are approximately equal to the reference potential VSS, namely 0V. The first and second control signals SCOM1 (output at mid-point A) and SCOM2 (output at mid-point B) are then approximately equal to the power supply VCC, namely 5V. The transistor TP3, the gate GP3 of which receives the first control signal SCOM1, is therefore put into a blocked state (switch open). On the other hand, the transistor TN3, the gate GN3 of which receives the second control signal SCOM2, is put into a conducting state (switch closed) in which it carries the reference potential VSS to the output 3.

For the second combination, the first and second input signals S1 and S2 are approximately equal to the power supply VCC, namely 5V. The first and second control signals SCOM1 and SCOM2 are then approximately equal to the reference potential VSS, namely 0V. Therefore the transistor TN3, the gate GN3 of which receives the second control signal SCOM2, is put into a blocked state (switch open). On the other hand, the transistor TP3, the gate GP3 of which receives the first control signal SCOM1, is put into a conducting state (switch closed) in which it carries the power supply VCC to the output 3.

For the third combination, the first input signal S1 is approximately equal to the reference potential VSS, namely 0V, and the second input signal S2 is approximately equal to the power supply VCC, namely 5V. The first control signal SCOM1 is then approximately equal to the power supply VCC and the second control signal SCOM2 is approximately equal to the reference potential VSS. Therefore the transistors TP3 and TN3 are both in the blocked state. Thus, for this combination, there is concomitant blocking of the switching means (TP3 and TN3 blocked). In this case, the result is high impedance output.

For the fourth combination, the first input signal S1 is approximately equal to the power supply VCC, namely 5V, and the second input signal S2 is approximately equal to the reference potential VSS, namely 0V. The first control signal SCOM1 is then approximately equal to the reference potential VSS and the second control signal SCOM2 is approximately equal to the power supply VCC. Therefore the transistors TP3 and TN3 are both in a conducting state.

Thus, for this combination, it is seen that prior art introduces a short circuit between the power supply VCC and the reference potential VSS.

Another major disadvantage of this first known technique lies in the fact that it has potential reliability problems by electromigration, particularly in the case of very fast buffers.

Furthermore, this first classical buffer has a large "di/dt" current variation in output transistors TP3 and TN3; which results in generation of high electromagnetic noise.

The traditional way of overcoming this short circuit problem is to introduce memory points into the above mentioned output buffer 100. As illustrated in FIG. 2, in the classical output buffer reference 200 (also referred to as the second classical buffer or buffer with anti short-circuit and without EMC optimization in the following description), the high memory point C is obtained by feedback from the first high switching means 303 to the first low inverter 302 (in other words the gate GP3 of transistor TP3 is connected to the source SP2 of transistor TP2) and the low memory point D is obtained by feedback from the first low switching means 304 to the first high inverter 301 (in other words the gate GN3 of transistor TN3 is connected to the source SN1 of transistor TN1). This double feedback imposes a stable voltage (or a stable logical level) on high and low memory points C and D, so as to delete indeterminate logical states of the first high and low switching means 303 and 304. This solution prevents putting switching means into conduction and prevents short circuit and the risk of failure by electromigration.

In the case of the fourth combination (S1 equal to VCC and S2 equal to VSS), transistors TN1 and TP2 are put into a conducting state and transistors TP1 and TN2 are put into a blocked state; consequently, the gates GP3 and GN3 of transistors TP3 and TN3 are connected together and are floating with respect to the reference potential VSS and the power supply VCC. Thus, for this combination, the double feedback creates a capacitive effect that keeps the SCOM1 and SCOM2 control signals (applied to gates GP3 and GN3 respectively) at their previous logical levels.

Although this solution according to prior art represented important progress in the mechanism to eliminate short circuits, the second known technique does have the disadvantages of having a fairly high <<di/dt>> (i.e. current variation) and a corresponding electromagnetic disturbance. The double feedback of the second classical buffer 200 provides the means of adjusting the slew rate of the output signal in response to a rising or falling front applied to the circuit input. In other words, this double feedback introduces an additional charge capacitance that slightly slows down control of the first high and low switching means 303 and 304 of the buffer 200. However, this control is incapable of reducing so-called "di/dt" output current peaks from the circuit sufficiently to obtain an acceptable generated noise.

SUMMARY

An aspect of the disclosure relates to an output buffer into which first and second input signals are applied and that delivers an output signal, said output signal possibly switching between a high logical level and a low logical level, and vice versa. The buffer comprises a first switching stage comprising:
  first high switching means to switch said output signal from said low logical level to said high logical level;
  first low switching means to switch said output signal from said high logical level to said low logical level;
  first high and low control means acting on said first high and low switching means respectively, said first high and low control means receiving said first and second input signals, respectively;
  first high and low memory points,
    the output from the first high control means and the input to said first high switching means being connected to said high memory point,
    the output from the first low control means and the input to said first low switching means being connected to said low memory point,
  According to an aspect of the disclosure, the buffer comprises a second offset switching stage installed in cascade downstream from said first switching stage and comprising:
    second high switching means of said output signal;
    second low switching means of said output signal;
    second high and low control means acting on said second high and low switching means respectively, through upstream high and low control points respectively;
      said second high and low control means receiving said first and second input signals respectively,
      said upstream high and low control points being shifted in time with respect to said high and low memory points, respectively.

Thus, an aspect of the disclosure is based on a quite new and inventive approach to immunity of an output buffer to noise and/or electromagnetic disturbances. The aspect proposes to combine an offset switching stage and a buffer fitted with an anti-short circuit. This offset switching stage also slows the maximum slew rate of the output signal in response to a voltage step applied to the input of the buffer.

Furthermore, the electromagnetic disturbance of the output buffer is advantageously reduced due to the reduction in the slew rate causing a reduction in the "di/dt" current peaks and "dv/dt" voltage peaks in the buffer.

It is also important to note that a de-correlation of controls to activate the switching means is also included. This de-correlation also eliminates switching errors, because each switching means receives a clear activation or deactivation command. Furthermore, the independent control of high and low switching means can significantly reduce the electrical consumption of the buffer, by assuring that only one of these switching means is activated at a given instant.

According to one advantageous aspect of the disclosure, said first generation means included in said first switching stage include a double feedback firstly from said first high switching means to said first low control means, and secondly from said first low switching means to said first high control means.

In one preferred embodiment of the disclosure, said second generation means included in said second offset switching stage comprise:

high timeout means receiving said high memory point and outputting said upstream high control point after a first determined timeout period has elapsed since the verification of at least one predetermined stability criterion;

low timeout means receiving said low memory point and outputting said upstream low control point after a second determined timeout period has elapsed since the verification of said at least one predetermined stability criterion;

Advantageously, said high timeout means comprise a first N type transistor and said low timeout means comprise a first P type transistor.

Preferably, said second high control means comprise a second P type transistor mounted with gate and drain common with said first N type transistor so as to form a first inverter, and said second low control means comprise a second N type transistor mounted with gate and drain common with said first P type transistor so as to form a second inverter.

Advantageously, said second high switching means included in said second offset switching stage comprise a third P type transistor comprising a gate on which said upstream high control point is applied, and in that if said upstream high control point is less than or equal to said low logical level, said third P type transistor enables switching of said output signal to the high logical level.

Preferably, said second low switching means included in said second offset switching stage comprise a third N type transistor comprising a gate on which said upstream low control point is applied, and in that if said upstream low control point is greater than or equal to said high logical level, said third N type transistor authorises switching of said output signal to the low logical level.

According to one advantageous aspect of the disclosure, the device comprises at least a third offset switching stage placed downstream from and identical to said second offset switching stage, each offset switching stage placed downstream from another offset switching stage allowing to generate additional downstream high and low control points shifted in time with respect to said upstream high and low control points respectively, generated in said upstream offset switching stage.

Preferably, said first high and low control means included in said first switching stage each comprise at least one inverter.

The disclosure also relates to an electronic circuit comprising an output buffer like that described above.

BACKGROUND

Other special features and advantages will become clearer after reading the following description of an embodiment given as a simple illustrative and non-limiting example, and the appended figures, wherein:

FIG. 1, already commented upon in relation to prior art, shows an electrical diagram of a classical buffer without anti short-circuit and without EMC optimization.

Figure 4:
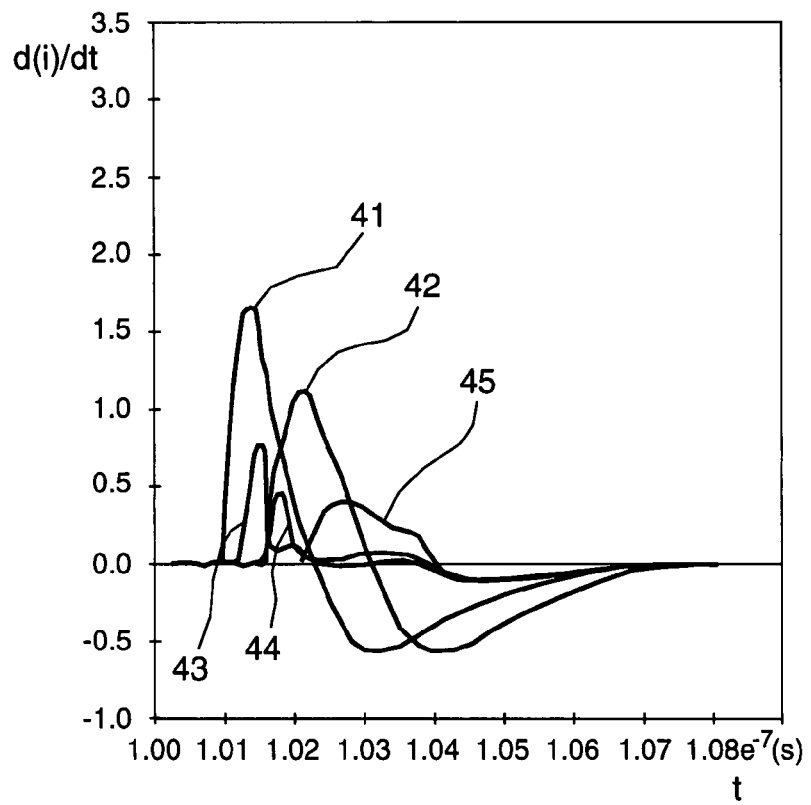

FIG. 4 presents the <<di/dt>> current variation of a buffer according to the disclosure for the increase in the output signal from VSS to VCC.

Figure 5:
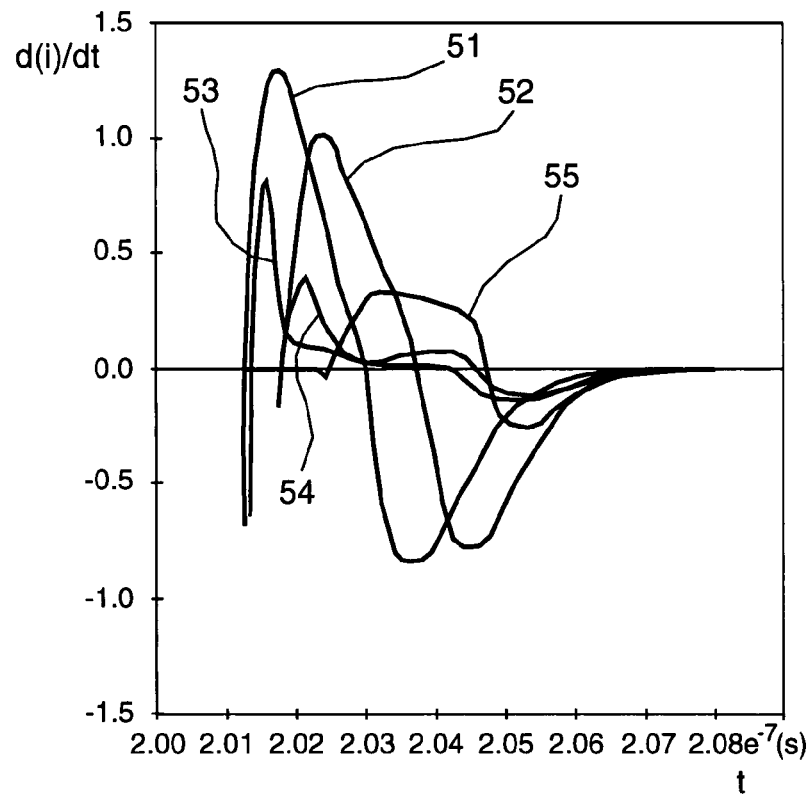

FIG. 5 presents the current variation <<di/dt>> of a buffer according to the disclosure, for reducing the output signal from VCC to VSS.

DETAILED DESCRIPTION OF ILLUSTRATIVE EMBODIMENTS

The general principle of an aspect of the disclosure is based on insertion of a stage with delay lines at the output from a buffer on which an anti-short circuit is fitted.

An offset switching stage comprises means of generating control points offset in time, to delay switching of the output signal. This offset switching stage slows the control of the slew rate, and thus reduces the amplitude of "di/dt" current peaks and "dv/dt" voltage peaks.

Figure 3:
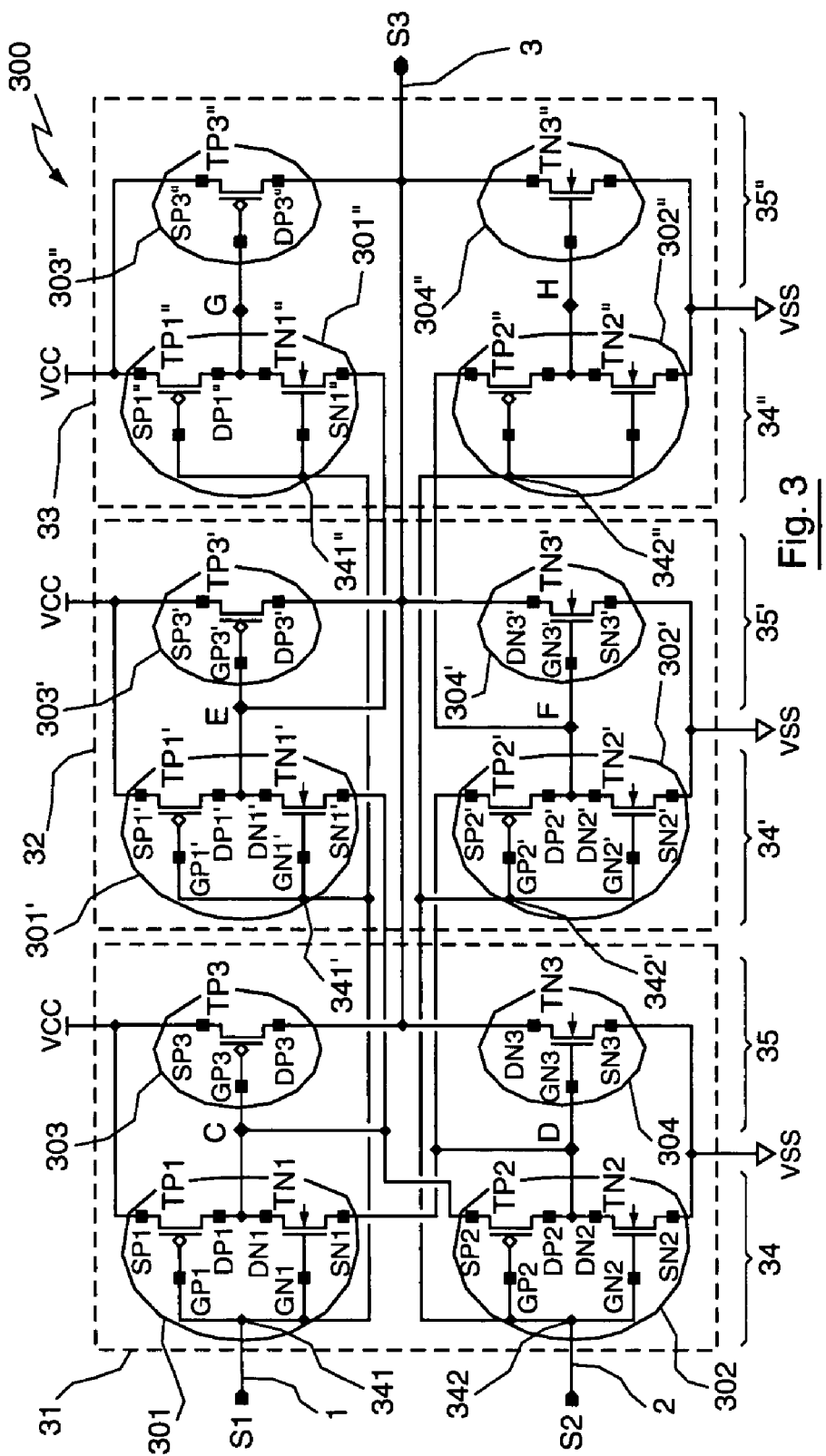
FIG. 3 shows the electrical diagram of a buffer according to an embodiment of the disclosure.

We will now describe an output buffer 300 according to an embodiment of the disclosure with relation to FIG. 3.

Figure 1:
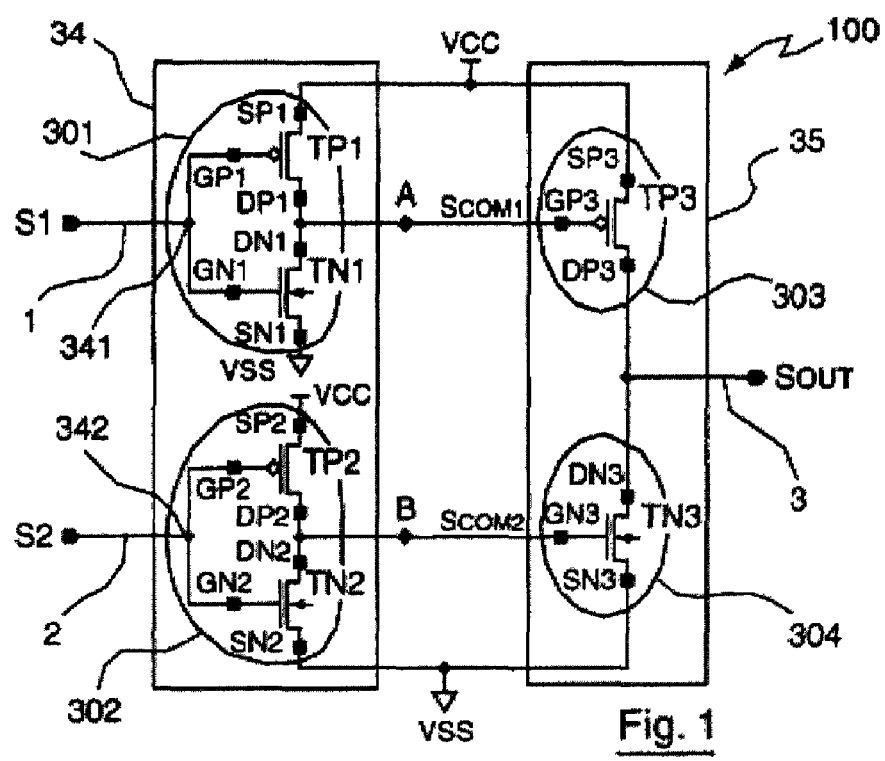
Figure 2:
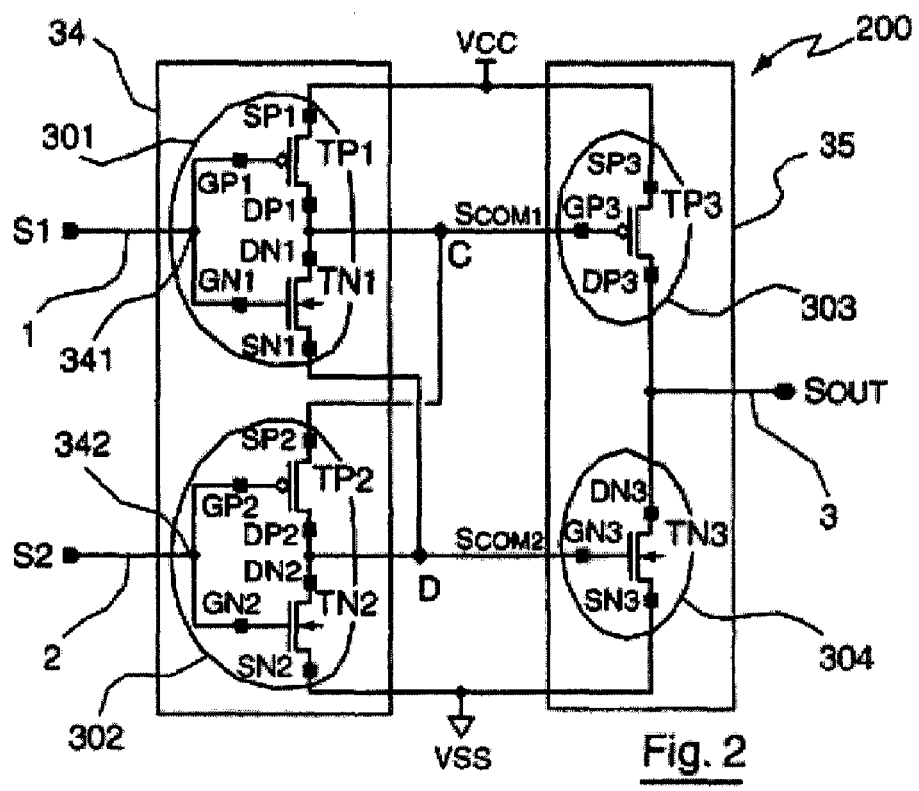
FIG. 2 shows an electrical diagram of a classical buffer with anti-short circuit and without EMC optimization.

In this embodiment, the output buffer 300 includes:
a first switching stage 31 acting as an buffer 200 with anti-short circuit and without EMC optimisation described with reference to FIG. 2; and
second and third offset switching stages 32 and 33 specific to an aspect of the disclosure.

For reasons of clarity, the detailed architecture and the operation described for the first switching stage 31 will not be described again in the following.

As a reminder, note that this first switching stage 31 comprises:
first high switching means 303 of an output signal SOUT from a low logical level (approximately equal to the reference potential VSS) to a high logical level (approximately equal to the power supply VCC);
first low switching means 304 switching the output signal SOUT from the high logical level to the low logical level;
first high and low control means 301 and 302 acting on the first high and low switching means 303 and 304 respectively; and
high and low memory points C and D, for switching the output signal SOUT such that if the high memory point C is significantly lower than the switching threshold of the first high switching means 303 (i.e. less than 2.5V) while the output signal SOUT switches to the high logical level (namely 5V), but on the other hand if the low memory point D is significantly greater than the switching threshold of the first low switching means 304 (i.e. greater than 2.5V) then the output signal SOUT switches to the low logical level (namely 0V).

Also as a reminder, these first high and low control means 301 and 302 firstly prevent simultaneous activation of the first high and low switching means 303 and 304, and secondly enable synchronised blocking of the first high and low switching means 303 and 304, so as to reduce the electrical consumption of the device.

As illustrated in FIG. 3, the second offset switching stage 32 is mounted in cascade downstream from the first switching stage 31, and the third offset switching stage 33 is mounted in cascade downstream from the second offset switching stage 32.

As will be seen later, the architecture of the third offset switching stage 33 is identical to the architecture of the second offset switching stage 32.

The output buffer 300 receives a first input signal S1 on a first input 1, and a second input signal S2 on a second input 2, and outputs an output signal SOUT at the output 3.

The second offset switching stage 32 comprises a second control stage 34' comprising second high and low inverters 301' and 302', and a second switching stage 35' comprising second high and low switching means 303' and 304'.

More precisely, the second high inverter 301' receives the first input signal S1 on an input 341' and outputs a third control signal SCOM1' on a first high control point E. This high inverter 301' includes a transistor TP1', the source SP1' of which is connected to the power supply VCC of the circuit and the drain DP1' of which is connected to the first high control point E, and a transistor TN1', the source SN1' of which is connected to the high memory point C (generated in the first switching stage 31) and the drain DN1' of which is connected to the drain DP1' of the transistor TP1'. Transistors TP1' and TN1' receive the first input signal S1 on their gate GP1' and GN1'.

Thus, when the first input signal S1 is approximately equal to the reference potential VSS, namely 0V, the transistor TP1' is made conducting and the transistor TN1' is blocked. After a certain latency (that depends on the ratio of the different dimensions of transistors TP1' and TN1'), the high inverter 301' outputs a third control signal SCOM1' to the first high control point E approximately equal to the power supply VCC, namely 5V.

Conversely, when the first input signal S1 is approximately equal to the power supply VCC, namely 5V, the transistor TN1' is made conducting and the transistor TP1' is blocked. After a certain latency (that depends on the ratio of the different dimensions of the transistors TP1' and TN1'), the high inverter 301' outputs a third control signal SCOM1' approximately equal to the potential of the high memory point C, to the first high control point E. In other words, when the first input signal S1 is approximately equal to the power supply VCC, the second offset switching stage 32 generates a first high control point E offset in time from the high memory point C.

The second low inverter 302' receives the second input signal S2 on an input 342', and outputs a fourth control signal SCOM2' on a first low control point F. This low inverter 302' comprises a transistor TP2', the source SP2' of which is connected to the low memory point D (generated in the first switching stage 31) and the drain DP2' of which is connected to the first low control point F, and a transistor TN2', the source SN2' of which is connected to the reference potential VSS and the drain DN2' of which is connected to the drain DP2' of the transistor TP2'. Transistors TP2' and TN2' receive the second input signal S2 on their gates GP2' and GN2'.

Thus, when the second input signal S2 is approximately equal to the reference potential VSS, namely 0V, the transistor TP2' is made conducting and the transistor TN2' is blocked. After a certain latency (that depends on the ratio of the various dimensions of the transistors TP2' and TN2'), the low inverter 302' outputs a fourth control signal SCOM2' to the first low control point F, approximately equal to the potential of the low memory point D. In other words, when the second input signal S2 is approximately equal to the reference potential VSS, the second offset switching stage 32 generates a first low control point F offset in time from the low memory point D.

Conversely, when the second input signal S2 is approximately equal to the power supply VCC, namely 5V, the transistor TN2' is made conducting and the transistor TP2' is blocked. After a certain latency (that depends on the ratio of the various dimensions of transistors TP2' and TN2'), the low inverter 302' outputs a fourth control signal SCOM2' approximately equal to the reference potential VSS, namely 0V, to the first low control point F.

The second high and low switching means 303' and 304' respectively, comprise a transistor TP3' and a transistor TN3' respectively.

The transistor TP3', the source SP3' of which is connected to the power supply VCC and the drain DP3' of which is connected to the output 3, forms a switch controlled by the third control signal SCOM1' (applied to the gate GP3').

The transistor TN3', the source SN3' of which is connected to the reference potential VSS and the drain DN3' of which is connected to the drain DP3' of the transistor TP3', forms a switch controlled by the fourth control signal SCOM2' (applied to gate GN3').

As already mentioned, the third offset switching stage 33 is placed on the output side of the second offset switching stage 32 and is identical to it.

In more detail, the third offset switching stage 33 comprises a third control stage 34" comprising third high and low inverters 301" and 302", and a third switching stage 35" comprising third high and low switching means 303" and 304".

More precisely, the third high inverter 301" receives the first input signal S1 on an input 341" and outputs a fifth control signal SCOM1" to a second high control point G. This high inverter 301" comprises a transistor TP1", the source SP1" of which is connected to the circuit power supply and the drain DP1" of which is connected to the second high control point G, and a transistor TN1", the source SN1" of which is connected to the first high control point E (generated in the second switching stage 32) and the drain DN1" of which is connected to the drain DP1" of the transistor TP1". The transistors TP1" and TN1" receive the first input signal S1 on their gates GP1" and GN1".

Thus, when the first input signal S1 is approximately equal to the reference potential VSS, namely 0V, the transistor TP1" is made conducting and the transistor TN1" is blocked. After a certain latency (that depends on the ratio of the various dimensions of transistors TP1" and TN1"), the high inverter 301" outputs a fifth control signal SCOM1" approximately equal to the power supply VCC, namely 5V, to the second high control point G.

Conversely, when the first input signal S1 is approximately equal to the power supply VCC, namely 5V, the transistor TN1" is made conducting and the transistor TP1" is blocked. After a certain latency (that depends on the ratio of the various dimensions of the transistors TP1" and TN1"), the high inverter 301" outputs a fifth control signal SCOM1" to the second high control point G, approximately equal to the potential of the first high control point E. In other words, when the first input signal S1 is approximately equal to the power supply VCC, the third offset switching stage 33 generates a second high control point G offset in time from the first high control point E.

The third low inverter 302" receives the second input signal S2 on an input 342" and outputs a sixth control signal SCOM2" onto a second low control point H. This low inverter 302" comprises a transistor TP2", the source SP2" of which is connected to the first low control point F (generated in the second switching stage 32) and the drain DP2" of which is connected to the second low control point H, and a transistor TN2", the source SN2" of which is connected to the reference potential VSS and the drain DN2" of which is connected to the drain DP2" of the transistor TP2". The transistors TP2" and TN2" receive the second input signal S2 on their gates GP2" and GN2".

Thus, when the second input signal S2 is approximately equal to the reference potential VSS, namely 0V, the transistor TP2" is made conducting and the transistor TN2" is blocked. After a certain latency (that depends on the ratio of the different dimensions of the transistors TP2" and TN2"), the low inverter 302" outputs a sixth control signal SCOM2" to the second low control point H, that is approximately equal to the potential of the first low control point F. In other words, when the second input signal S2 is approximately equal to the reference potential VSS, the third offset switching stage 33 generates a second low control point H offset in time from the first low control point F.

Conversely, when the second input signal S2 is approximately equal to the power supply VCC, namely 5V, the transistor TN2" is made conducting and the transistor TP2" is blocked. After a certain latency (that depends on the ratio of the various dimensions of transistors TN2" and TP2") the low inverter 302" outputs a sixth control signal SCOM2" to the second low control point H, that is approximately equal to the reference potential VSS, namely 0V.

The third high and low switching means 303" and 304" comprise a transistor TP3" and transistor TN3" respectively.

The transistor TP3", the source SP3" of which is connected to the power supply VCC and the drain DP3" of which is connected to the output 3, form a switch controlled by the fifth control signal SCOM1" (applied to the gate GP3").

The transistor TN3", the source SN3" of which is connected to the reference potential VSS and the drain DN3" of which is connected to the drain DP3" of the transistor TP3", forms a switch controlled by the sixth control signal SCOM2" (applied to the gate GN3").

As already mentioned, the first switching stage 31 comprises a double feedback for generating a stable voltage on the gates of switching transistors TP3 and TN3 (when the first input signal S1 is equal to the power supply VCC and the second input signal S2 is equal to the reference potential VSS), so as to prevent a short circuit, in other words simultaneous activation of the switching transistors TP3 and TN3.

In order to simplify the description given in the remainder of this document, it will be limited to describing the special case of a double feedback generating a stable voltage equal to about 0V.

We will describe the operation of an output buffer 300, for four combinations of input signals S1 and S2, with reference to FIG. 3.

For the first combination, the first and second input signals S1 and S2 are approximately equal to the reference potential VSS, namely 0V.

Initially, the first and second control signals SCOM1 (output to the high memory point C) and SCOM2 (output to the low memory point D) are equal to the power supply voltage VCC, namely 5V.

After a first latency (corresponding to a delay introduced by the second high and low inverters 301' and 302' of the second offset switching stage 32), the third and fourth control signals SCOM1' (output to the first high control point E) and SCOM2' (output to the first low control point F) are equal to the value of the power supply VCC, namely 5V.

After a second latency (corresponding to a delay introduced by the third high and low inverters 301" and 302" of the third offset switching stage 33), the fifth and sixth control signals SCOM1" (output to the second high control point G) and SCOM2" (output to the second low control point H) are equal to the power supply VCC, namely 5V.

Thus, the switching transistors TN3 of the first switching stage 31, TN3' of the second offset switching stage 32, and TN3" of the third offset switching stage 33, are placed one after the other in a conducting state so as to obtain a delayed switching of the output signal SOUT (delivered to the output 3) to the reference potential VSS, namely 0V.

As we will see later, each switching stage contributes to reducing the <<di/dt>> current peaks in the device.

For the second combination, the first and second input signals S1 and S2 are approximately equal to the power supply VCC, namely 5V.

Initially, the first and second control signals SCOM1 (delivered to the high memory point C) and SCOM2 (delivered to the low memory point D) are set equal to the reference potential value VSS, namely 0V.

After a first latency (corresponding to a delay introduced by the second high and low inverters 301' and 302' of the second offset switching stage 32), the second and fourth control signals SCOM1' (output to the first high control point E) and SCOM2' (output to the first low control point F) are equal to the value of the reference potential VSS, namely 0V.

After a second latency (corresponding to a delay introduced by the third high and low inverters 301' and 302' of the third offset switching stage 33), the fifth and sixth control signals SCOM1' (output to the second high control point G) and SCOM2' (output to the second low control point H) are equal to the value of the reference potential VSS, namely 0V.

Thus, the switching transistors TP3 of the first switching stage 31, TP3' of the second switching offset switching stage 32, and TP3" of the third offset switching stage 33 are placed one after the other in a conducting state, so as to obtain a delayed switching of the output signal SOUT (delivered to the output 3) to power supply VCC, namely 5V.

For the third combination, the first input signal S1 is approximately equal to the reference potential VSS, namely 0V, and the second input signal S2 is approximately equal to the power supply VCC, namely 5V.

Initially the first control signal SCOM1 (output to the high memory point C) is equal to the value of the power supply VCC and the second control signal SCOM2 (output to the low memory point D) is equal to the value of the reference potential VSS.

After a first latency (corresponding to a delay introduced by the second high and low inverters 301' and 302' of the second offset switching stage 32), the third control signal SCOM1' (output to the first high control point E) is equal to the value of the power supply VCC and the fourth control signal SCOM2' (output to the first low control point F) is equal to the value of the reference potential VSS.

After a second latency (corresponding to a delay introduced by the third high and low inverters 301" and 302" of the third offset switching stage 33), the fifth control signal SCOM1" (output to the second high control point G) is equal to the value of the power supply VCC and the sixth control signal SCOM2" (output to the second low control point H) is equal to the value of the reference potential VSS.

Thus, for this combination, the result is concomitant blocking of the switching means (the switching transistors of each switching stage are blocked). In this case, the result is a high impedance output.

For the fourth combination, the first input signal S1 is approximately equal to the power supply VCC, namely 5V, and the second input signal S2 is approximately equal to the reference potential VSS, namely 0V.

For this combination, the double feedback imposes a stable voltage of 0V on the high and low memory points C and D.

Since the control transistors TN1 and TP2 of the first switching stage 31, TN1' and TP2' of the second offset switching stage 32, and TN2" and TP2" of the third offset switching stage 33 are in a conducting state, this stable voltage progressively propagates in each switching stage, such that the control signals of each stage are set equal to the value of the stable voltage, namely 0V.

Thus, the switching transistors TP3 of the first switching stage 31, TP3' of the second offset switching stage 32, and TP3' of the third offset switching stage 33 are placed one after the other in a conducting state, so as to obtain retarded switching of the output signal SOUT (at output 3) to the power supply VCC, namely 5V.

We will now present the performances (obtained by simulation) of the output buffer 300, with reference to FIG. 4, for a combination of input signals S1 and S2 (where S1 and S2 are equal to VCC) corresponding to raising the output signal SOUT from VSS to VCC.

More precisely, FIG. 4 presents five curves references 41 to 45 illustrating the <<di/dt>> current variation as a function of time t (in s) for the first classical buffer 100, the second classical buffer 200, and the buffer 300 according to the disclosure.

Thus, the curve reference 41 corresponds to the variation of the "di/dt" current in the first classical buffer 100, the curve reference 42 corresponds to the current variation "di/dt" in the second classical buffer 200 and the curves referenced 43, 44 and 45 correspond to the current variation "di/dt" at the first 31, second 32 and third 33 switching stages of the buffer 300, respectively.

As illustrated on FIG. 4, the performances of the buffer according to the disclosure are satisfactory because it reduces current peaks "di/dt" by the order of 60% below the value for a classical buffer 100.

FIG. 5 shows the performances (obtained by simulation) of the output buffer 300, for a combination of input signals S1 and S2 (S1 and S2 are equal to VSS) corresponding to the drop in the output signal SOUT from VCC to VSS.

More precisely, FIG. 5 shows five curves referenced 51 to 55 illustrating the current variation "di/dt" as a function of time t (in s) for the first classical buffer 100, the second classical buffer 200 and the buffer 300.

Thus, the curve reference 51 corresponds to the current variation "di/dt" in the first classical buffer 100, curve reference 52 corresponds to the current variation "di/dt" in the second classical buffer 200 and curves reference 53, 54 and 55 correspond to the current variation "di/dt" in the first 31, second 32 and third 33 switching stages of the buffer 300, respectively.

As illustrated on FIG. 5, the buffer according to the disclosure has satisfactory performances because it reduces "di/dt" current peaks by the order of 40% below the value for a classical buffer 100.

In summary, at least one embodiments of the disclosure provides a technique for reducing the electromagnetic disturbance of an output buffer.

At least one embodiment provides such a system for reducing the noise of an output buffer.

In at least one embodiment, such a system can reduce the <<di/dt>> current peaks, for identical performances in terms of rise and fall times of the output signal.

At least one embodiment provides such a system avoiding unnecessary electrical consumption.

At least one embodiment provides such a system that is easy to implement and inexpensive.

Although the present disclosure has been described with reference to one or more embodiments, workers skilled in the art will recognize that changes may be made in form and detail without departing from the spirit and scope of the disclosure and/or the appended claims.

What is claimed is:

1. Output buffer into which first and second input signals are applied and that delivers an output signal, said output signal being switchable between a high logical level and a low logical level, and vice versa, said buffer comprising a first switching stage comprising:

first high switching means to switch said output signal from said low logical level to said high logical level;

first low switching means to switch said output signal from said high logical level to said low logical level;

first high and low control means acting on said first high and low switching means respectively, said first high and low control means receiving said first and second input signals, respectively;

first high and low memory points, the output from the first high control means and the input to said first high switching means being connected to the first high memory point, the first high memory point further connected to the first low control means and to a second high control means, the output from the first low control means and the input to said first low switching means being connected to the first low memory point, the first low memory point further connected to the first high control means and to a second low control means;

wherein said buffer comprises a second offset switching stage installed in cascade downstream from said first switching stage and comprising:

second high switching means of said output signal;

second low switching means of said output signal; and second high and low control means acting on said second high and low switching means respectively, through upstream high and low control points respectively, said second high and low control means receiving said first and second input signals respectively, said upstream high and low control points being delayed in time with respect to said high and low memory points, respectively and wherein the second high control means includes an inverter that includes an input connected to the first input signal and an output connected to the second high switching means and is connected to a power supply and the first high memory point; and wherein the second high control means is connected to the second high switching means.

2. The output buffer set forth in claim 1, wherein said second high switching means included in said second offset switching stage, comprise a third P type transistor comprising a gate on which said upstream high control point is applied and is connected to the second high and low control means, and in that if said upstream high control point is less than or equal to said low logical level, said third P type transistor enables switching of said output signal to the high logical level.

3. The output buffer set forth in claim 1, wherein said second low switching means included in said second offset switching stage, comprise a third N type transistor comprising a gate on which said upstream low control point is applied, and in that if said upstream low control point is greater than or equal to said high logical level, said third N type transistor enables switching of said output signal to the low logical level.

4. The output buffer set forth in claim 1 and further comprising at least a third offset switching stage placed downstream from said second offset switching stage and comprising identical components to said second offset switching stage, each offset switching stage placed downstream from another offset switching stage providing additional downstream high and low control points delayed in time with respect to said upstream high and low control points respectively, generated in said upstream offset switching stage.

5. The output buffer set forth in claim 1, wherein said first high and low control means included in said first switching stage, each comprise at least one inverter.

6. Output buffer into which first and second input signals are applied and that delivers an output signal, the output signal being switchable between a high logical level and a low logical level, and vice versa, the output buffer comprising:
a first switching stage, which comprises:
a first high switch to switch the output signal from the low logical level to the high logical level;
first low switch to switch the output signal from the high logical level to the low logical level;
first high and low control circuit acting on the first high and low switches, respectively, the first high and low control circuits receiving the first and second input signals, respectively; and
first high and low memory points,
the output from the first high control circuit and the input to the first high switch being connected to the first high memory point, the first high memory point further connected to the first low control circuit and to a second high control circuit,
the output from the first low control circuit and the input to the first low switch being connected to the first low memory point, the first low memory point further connected to the first high control circuit and to a second low control circuit; and
a second offset switching stage installed in cascade downstream from the first switching stage and comprising:
a second high switch to switch the output signal;
a second low switch to switch the output signal; and
second high and low control circuits acting on the second high and low switches respectively, through upstream high and low control points respectively, the second high and low control circuits receiving the first and second input signals respectively, the upstream high and low control points being delayed in time with respect to the high and low memory points, and wherein the second high control circuit includes an inverter that includes an input connected to the first input signal and an output connected to the second high switch and is connected to a power supply and the first high memory point; and
wherein the second high control circuit is connected to the second high switch.

7. The output buffer set forth in claim 6, wherein said second high switch included in said second offset switching stage, comprises a third P type transistor comprising a gate on which said upstream high control point is applied, and in that if said upstream high control point is less than or equal to said low logical level, said third P type transistor enables switching of said output signal to the high logical level.

8. The output buffer set forth in claim 6, wherein said second low switch included in said second offset switching stage, comprises a third N type transistor comprising a gate on which said upstream low control point is applied, and in that if said upstream low control point is greater than or equal to said high logical level, said third N type transistor enables switching of said output signal to the low logical level.

9. The output buffer set forth in claim 6 and further comprising at least a third offset switching stage placed downstream from said second offset switching stage and comprising identical components to said second offset switching stage, each offset switching stage placed downstream from another offset switching stage providing additional downstream high and low control points delayed in time with respect to said upstream high and low control points respectively, generated in said upstream offset switching stage.

10. The output buffer set forth in claim 6, wherein said first high and low control circuits included in said first switching stage, each comprises at least one inverter.

11. An electronic circuit comprising an output buffer into which first and second input signals are applied and that delivers an output signal, the output signal being switchable between a high logical level and a low logical level, and vice versa, wherein the output buffer comprises:
a first switching stage, which comprises:
a first high switch to switch the output signal from the low logical level to the high logical level;
first low switch to switch the output signal from the high logical level to the low logical level;
first high and low control circuit acting on the first high and low switches, respectively, the first high and low control circuits receiving the first and second input signals, respectively; and
first high and low memory points,
the output from the first high control circuit and the input to the first high switch being connected to the high memory point, the first high memory point further connected to the first low control circuit and to a second high control circuit,
the output from the first low control circuit and the input to the first low switch being connected to the low memory point, the first low memory point further connected to the first high control circuit and to a second low control circuit; and
a second offset switching stage installed in cascade downstream from the first switching stage and comprising:
a second high switch to switch the output signal;
a second low switch to switch the output signal; and
second high and low control circuits acting on the second high and low switches respectively, through upstream high and low control points respectively, the second high and low control circuits receiving the first and second input signals respectively, the upstream high and low control points being delayed in time with respect to the high and low memory points, respectively and wherein the second high control circuit includes an inverter that includes an input connected to the first input signal and an output connected to the second high switch and is connected to a power supply and the first high memory point; and wherein the second high control circuit is connected to the second high switch.

12. An output buffer comprising:

first and second input signals, the first and second input signals switchable between a high logical level and a low logical level;

a first switching stage comprising:
- a first high control circuit configured to receive the first input signal and output a first control signal;
- a first low control circuit configured to receive the second input signal and output a second control signal;
- a first high switch configured to receive the output of the first high control circuit and switch the logical level of the first control signal;
- a first low switch configured to receive the output of the first low control circuit and switch the logical level of the second control signal;
- a first high memory point connected between the output of the first high control circuit and the input of the first high switch; and
- a second high memory point connected between the output of the first low control circuit and the input of the first low switch; and a second offset switching stage comprising:
- a second high control circuit configured to receive the first input signal and, after a latency period, output a third control signal, and wherein the second high control circuit includes an inverter that includes an input connected to the first input signal and an output connected to a second high switch and is connected to a power supply and the first high memory point;
- a second low control circuit configured to receive the second input signal and, after a latency period, output a fourth control signal;
- the second high switch configured to receive the output of the second high control circuit and switch the logical level of the third control signal, wherein the second high switch is connected to the second high control circuit;
- a second low switch configured to receive the output of the second low control circuit and switch the logical level of the fourth control signal;
- a first high control point connected between the output of the second high control circuit and the input of the second high switch, the first high control point time-delayed with respect to the first high memory point; and
- a first low control point connected between the output of the second low control circuit and the input of the second low switch, the first low control point time-delayed with respect to the first low memory point.

13. The output buffer of claim 12, wherein the first and second high and low control circuits each comprise an N-channel transistor and a P-channel transistor.

14. The output buffer of claim 13, further comprising:
- the first high memory point connected to the source of the P-channel transistor of the first low control circuit and to the source of the N-channel transistor of the second high control circuit; and
- the first low memory point connected to the source of the N-channel transistor of the first high control circuit and to the source of the P-channel transistor of the second low control circuit.

15. The output buffer of claim 12, further comprising:

a third offset switching stage comprising:
- a third high control circuit configured to receive the first input signal and, after a latency period, output a fifth control signal;
- a third low control circuit configured to receive the second input signal and, after a latency period, output a sixth control signal;
- a third high switch configured to receive the output of the third high control circuit and switch the logical level of the fifth control signal;
- a third low switch configured to receive the output of the third low control circuit and switch the logical level of the sixth control signal;
- a second high control point connected between the output of the third high control circuit and the input of the third high switch, the second high control point time-delayed with respect to the first high control point; and
- a second high control point connected between the output of the third low control circuit and the input of the third low switch, the second low control point time-delayed with respect to the first low control point.

16. The output buffer of claim 15, wherein the first, second and third high and low control circuits each comprise an N-channel transistor and a P-channel transistor.

17. The output buffer of claim 16, further comprising:
- the first high memory point connected to the source of the P-channel transistor of the first low control circuit and to the source of the N-channel transistor of the second high control circuit;
- the first low memory point connected to the source of the N-channel transistor of the first high control circuit and to the source of the P-channel transistor of the second low control circuit;
- the first high control point connected to the source of the N-channel transistor of the third high control circuit; and
- the first low control point connected to the source of the P-channel transistor of the third low control circuit.

18. The output buffer of claim 1, wherein the second high control means is not connected to output signal.

* * * * *

UNITED STATES PATENT AND TRADEMARK OFFICE
CERTIFICATE OF CORRECTION

PATENT NO. : 8,239,429 B2
APPLICATION NO. : 11/786424
DATED : August 7, 2012
INVENTOR(S) : Abdellatif Bendraoui et al.

It is certified that error appears in the above-identified patent and that said Letters Patent is hereby corrected as shown below:

Column 2, line 18, please delete "GP 1" and insert therefor -- GP1 --;

Column 10, line 39, please delete "301'" and insert therefor -- 301" --;

Column 10, line 39, please delete "302'" and insert therefor -- 302" --;

Column 10, line 41, please delete "SCOM1'" and insert therefor -- SCOM1" --; and Column 10, line 42, please delete "SCOM2'" and insert therefor -- SCOM2" --.

Signed and Sealed this
Sixth Day of November, 2012

David J. Kappos
*Director of the United States Patent and Trademark Office*